United States Patent
Ha et al.

(10) Patent No.: US 7,739,535 B2
(45) Date of Patent: Jun. 15, 2010

(54) SYSTEM INCLUDING AN OPERATING SPEED DETECTION APPARATUS, AN OPERATING SPEED DETECTION APPARATUS AND METHOD THEREOF

(75) Inventors: Hyun-Wook Ha, Pyeongtaek-si (KR); Jong-Ho Roh, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 858 days.

(21) Appl. No.: 11/340,671

(22) Filed: Jan. 27, 2006

(65) Prior Publication Data

US 2006/0184815 A1 Aug. 17, 2006

(30) Foreign Application Priority Data

Feb. 12, 2005 (KR) .................... 10-2005-0011735

(51) Int. Cl.
*G06F 1/00* (2006.01)
(52) U.S. Cl. .................. 713/500; 713/300; 713/322
(58) Field of Classification Search ............. 713/300, 713/322, 500
See application file for complete search history.

(56) References Cited

U.S. PATENT DOCUMENTS

| | | | | |
|---|---|---|---|---|
| 5,126,691 | A * | 6/1992 | Mijuskovic et al. | 331/1 A |
| 5,822,267 | A | 10/1998 | Watanabe et al. | |
| 6,349,387 | B1 | 2/2002 | Blomgren et al. | |
| 6,573,776 | B2 * | 6/2003 | Miyamoto | 327/276 |
| 6,664,838 | B1 * | 12/2003 | Talledo | 327/277 |
| 6,891,416 | B2 * | 5/2005 | Miyamoto | 327/161 |
| 6,937,076 | B2 * | 8/2005 | Gomm | 327/158 |
| 6,992,514 | B2 * | 1/2006 | Kim et al. | 327/161 |
| 7,256,628 | B2 * | 8/2007 | Drost et al. | 327/147 |
| 7,279,938 | B1 * | 10/2007 | Lin | 327/3 |
| 7,298,189 | B2 * | 11/2007 | Kang et al. | 327/158 |

(Continued)

FOREIGN PATENT DOCUMENTS

JP 2000-243080 9/2000

(Continued)

OTHER PUBLICATIONS

Korean Office Action dated May 26, 2006 received in corresponding Korean Application No. 10-2005-011735 with English translation.

(Continued)

*Primary Examiner*—Thomas Lee
*Assistant Examiner*—Jaweed A Abbaszadeh
(74) *Attorney, Agent, or Firm*—Harness, Dickey & Pierce, P.L.C.

(57) ABSTRACT

A system including an operating speed detection apparatus, an operating speed detection apparatus and method thereof. In the example method, a received clock signal may be delayed to generate a plurality of delayed clock signals. A plurality of detection signals may be generated based on the plurality of delayed clock signals and the received clock signal. An operating speed (e.g., of a system) may be determined based at least in part on the plurality of detection signals. In an example, the example method may be performed by an operating speed detection apparatus. In another example, the example method may be performed by a system including the operating speed detection apparatus.

25 Claims, 3 Drawing Sheets

U.S. PATENT DOCUMENTS

| | | | |
|---|---|---|---|
| 2002/0140483 A1* | 10/2002 | Miyamoto | 327/276 |
| 2003/0214339 A1* | 11/2003 | Miyamoto | 327/276 |
| 2004/0103330 A1* | 5/2004 | Bonnett | 713/322 |
| 2005/0013396 A1* | 1/2005 | Kliesner et al. | 375/372 |
| 2005/0242854 A1* | 11/2005 | Kang et al. | 327/158 |

FOREIGN PATENT DOCUMENTS

| | | |
|---|---|---|
| KR | P2000-0001906 | 1/2000 |
| KR | 10-0353543 B1 | 9/2002 |
| KR | 10-2003-0041484 | 5/2003 |

OTHER PUBLICATIONS

Chinese Patent Office Office Action dated May 8, 2009 for counterpart Chinese application.

* cited by examiner

SYSTEM INCLUDING AN OPERATING SPEED DETECTION APPARATUS, AN OPERATING SPEED DETECTION APPARATUS AND METHOD THEREOF

PRIORITY STATEMENT

This application claims the benefit of Korean Patent Application No. 10-2005-0011735, filed on Feb. 12, 2005, in the Korean Intellectual Property Office, the disclosure of which is incorporated herein in its entirety by reference.

BACKGROUND OF THE INVENTION

1. Field of the Invention

Example embodiments of the present invention are related generally to a system including an operating speed detection apparatus, an operating speed detection apparatus and method thereof.

2. Description of the Related Art

In mobile electronic devices, lower power consumption and multi-functionality may be factors in a design process. Multi-functional mobile electronic devices may employ real-time processing (e.g., displaying video images, receiving broadcast signals, etc.), which may increase hardware requirements (e.g., memory capacity, processor speed, etc.) of the device. Semiconductor chips, which may be included in mobile electronic devices, may operate in accordance with higher-speed clock signals (e.g., for synchronous processing). Accordingly, a reliability of a semiconductor chip may be based at least in part on a reliability of internal clock signals within the semiconductor chip.

If semiconductor chip operating status information is provided indicating how circuits within a semiconductor chip may operate in response to a given clock signal, an operating speed (e.g., processor frequency) of the semiconductor chip may be increased and/or a power consumption of the semiconductor chip may be reduced by adjusting a frequency of the clock signal and/or an internal voltage via a voltage regulator.

By conventional methods, operations of semiconductor chips using a clock signal at a given frequency or speed may employ a table specifying a relationship (e.g., expressed as an equation) between a system response speed and an associated power consumption. In another example, actual data obtained through real-world tests and/or experiments may populate the table.

Semiconductor chips having equivalent functions in the same system may operate at different speeds and/or frequencies, for example due to variations in semiconductor manufacturing processes, differences in local operating temperatures, differences in operating voltages of the chips, and/or other structural and/or environmental factors.

Conventional semiconductor memory devices including a temperature sensor may control a supply power based on an operating temperature detected by a temperature sensor. However, the temperature sensor may increase both a manufacturing cost and a chip size of semiconductor memory devices.

SUMMARY OF THE INVENTION

An example embodiment of the present invention is directed to an operating speed detection apparatus detecting an operating speed, including a delay block delaying a clock signal to generate a plurality of delayed clock signals and a detection block outputting a plurality of detection signals indicating the operating speed based on the clock signal and the plurality of delayed clock signals.

Another example embodiment of the present invention is directed to a system including a plurality of functional blocks operating in response to a clock signal, including an operating speed detection apparatus detecting an operating speed of the plurality of functional blocks.

Another example embodiment of the present invention is directed to a method for detecting an operating speed, including delaying a received clock signal to generate a plurality of delayed clock signals, generating a plurality of detection signals based on the plurality of delayed clock signals and the received clock signal and determining the operating speed based at least in part on the plurality of detection signals.

BRIEF DESCRIPTION OF THE DRAWINGS

The accompanying drawings are included to provide a further understanding of example embodiments of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS OF THE PRESENT INVENTION

Figure 1:
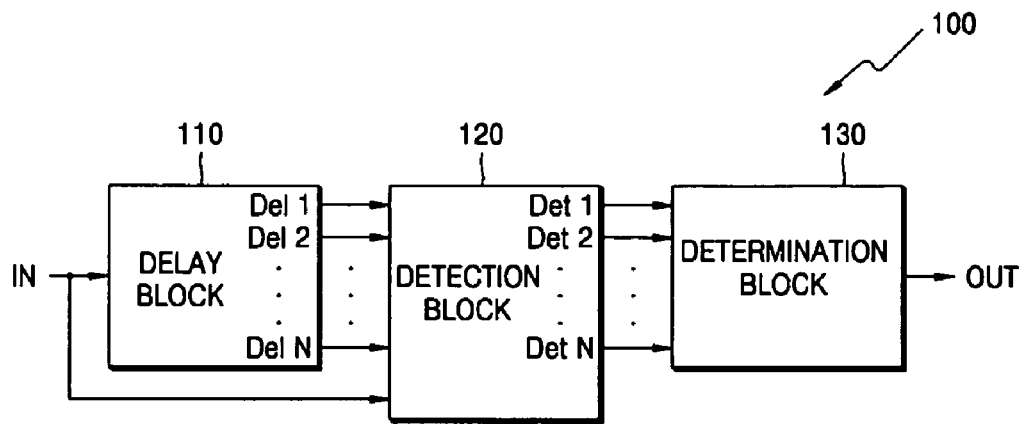
FIG. 1 is a block diagram of an operating speed detection apparatus according to an example embodiment of the present invention.

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while example embodiments of the invention are susceptible to various modifications and alternative forms, specific embodiments thereof are shown by way of example in the drawings and will herein be described in detail. It should be understood, however, that there is no intent to limit example embodiments of the invention to the particular forms disclosed, but conversely, the invention is to cover all modifications, equivalents, and alternatives falling within the spirit and scope of the invention.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected", "mounted on", "on" or "coupled" to another element, it can be directly connected/mounted on/on/ coupled to the other element or intervening elements may be present. Conversely, when an element is referred to as being "directly connected", "directly mounted on", "directly on", "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments of this invention belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments of the present invention will be described in detail with reference to the accompanying drawings.

In the Figures, the same reference numerals are used to denote the same elements throughout the drawings.

FIG. 1 is a block diagram of an operating speed detection apparatus 100 according to an example embodiment of the present invention.

In the example embodiment of FIG. 1, the operating speed detection apparatus 100 may detect an operating speed of a system operating in response to a clock signal. The operating speed detection apparatus 100 may include a delay block 110 and a detection block 120 for detecting the operating speed. In a further example, the operating speed detection apparatus 100 may include a determination block 130. However, it is understood that other example embodiments may be directed to an operating speed detection apparatus including the delay block 110 and the detection block 120 without the determination block 130.

In the example embodiment of FIG. 1, the delay block 110 may delay a clock signal IN based on a unit time to output first through N-th delay signals Del 1 through Del N. In an example, each of the first through N-th delay signals Del 1 through Del N may be delayed for a different multiple of the unit time. N is an integer greater than or equal to 1.

In the example embodiment of FIG. 1, the detection block 120 may output first through N-th detection signals Det 1 through Det N based on the first through N-th delay signals Del 1 through Del N and the clock signal IN.

In the example embodiment of FIG. 1, the determination block 130 may determine the operating speed of the system based on the first through N-th detection signals Det 1 though Det N. The determination block 130 may output an output signal OUT indicating the determined operation speed.

Figure 2:
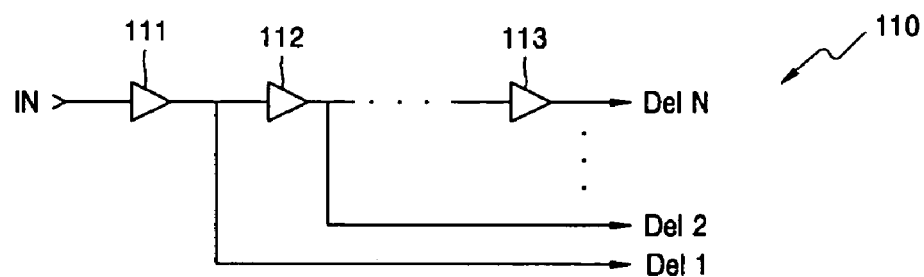
FIG. 2 is a circuit diagram illustrating a delay block according to another example embodiment of the present invention.

FIG. 2 is a circuit diagram illustrating the delay block 110 of FIG. 1, according to another example embodiment of the present invention.

In the example embodiment of FIG. 2, the delay block 110 may include first through N-th delay circuits 111 through 113. The first delay circuit 111 may delay the clock signal IN by the unit time to generate and output the first delay signal Del 1. The second delay circuit 112 may delay the first delay signal Del 1 by the unit time to generate and output the second delay signal Del 2. The N-th delay circuit 113 may delay a (N-1)-th delay signal (not shown) Del (N-1) by the unit time to generate output the N-th delay signal Del N. Thus, each of the first through N-th delay circuits 111 through 113 may output the clock signal IN delayed by a multiple of the unit time (e.g., where the delay may be a sequential multiple of the unit time, such as 1*unit time, 2*unit time, . . . , N*unit time).

In another example embodiment of the present invention, referring to FIG. 2, each of the first through N-th delay circuits may be implemented as a buffer. The unit time may be set based on application specific criteria. Hereinafter, it may be assumed that the unit time may be 1 nanosecond (ns). It is understood that other example embodiments of the present invention may be configured for any other unit time.

Figure 3:
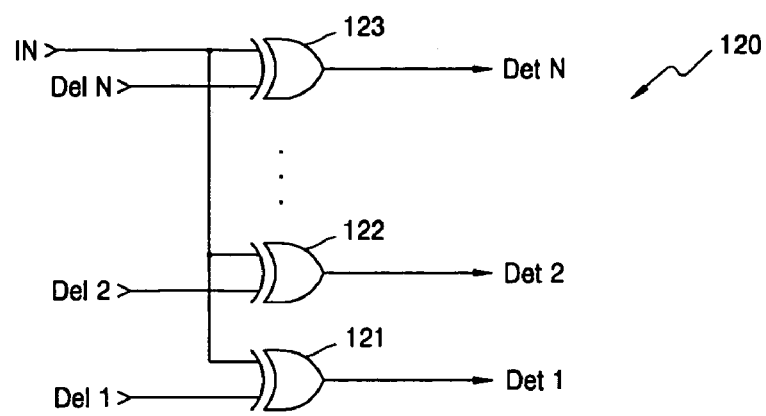
FIG. 3 is a circuit diagram illustrating a detection block according to another example embodiment of the present invention.

FIG. 3 is a circuit diagram illustrating the detection block 120 of FIG. 1, according to another example embodiment of the present invention.

In the example embodiment of FIG. 3, the detection block 120 may include first through N-th detection circuits 121 through 123. In an example, each of the detection circuits 121 through 123 may be embodied as an Exclusive OR (XOR) circuit. In an alternative example, the detection circuits 121 through 123 may each be configured as any Boolean circuit (e.g., a combination of circuits including at least one of an AND gate, a NOR gate, an OR gate, a NAND gate, an inverter, etc.).

In the example embodiment of FIG. 3, the first detection circuit 121 may compare the first delay signal Del 1 with the clock signal IN and may output the first detection signal Det 1 based on the comparison. The first detection signal Det 1 may indicate information regarding a delay time of the clock signal IN.

In the example embodiment of FIG. 3, the second detection circuit 122 may compare the second delay signal Del 2 with the clock signal IN and may output the second detection signal Det 2 based on the comparison. The second detection signal Det 2 may indicate information regarding a delay time of the clock signal IN.

In the example embodiment of FIG. 3, the N-th detection circuit 123 may compare the N-th delay signal Del N with the clock signal IN and may output the N-th detection signal Det N based on the comparison. The N-th detection circuit 123 may indicate information regarding a delay time of the clock signal IN. For example, the combination of the first through N-th detection signals Det 1 through Det N may allow an operating speed of the clock signal IN to be determined.

Figure 4:
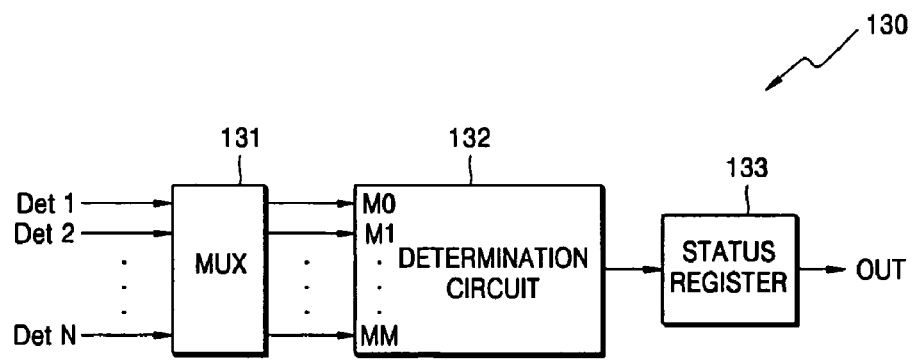
FIG. 4 is a block diagram illustrating a determination block according to another example embodiment of the present invention.

FIG. 4 is a block diagram illustrating the determination block 130 of FIG. 1 according to another example embodiment of the present invention.

In the example embodiment of FIG. 4, the determination block 130 may include a multiplexer 131, a determination circuit 132 and a status register 133. The multiplexer 131 may select at least one of the first through N-th detection signals Det 1 through Det N and may transfer the at least one selected signal to the determination circuit 132 as output signals MO through MM, where M may be a positive integer greater than or equal to 1. The determination circuit 132 may determine an operating speed of the system based on the output signals MO through MM received from the multiplexer 131. The status register 133 may store and output the operating speed determined by the determination circuit 132.

Hereinafter, example operation of the operating speed detection apparatus 100 will be described with reference to FIGS. 1-4. In the following description of example operation of the operating speed detection apparatus 100 of FIG. 1, a frequency of a clock signal of a system using the operating speed detection apparatus may be 100 MHz and the unit time (e.g., for sequentially delaying the clock signal IN) may be 1 ns. It is understood that these values are given for purposes of example only, and other example embodiments of the present invention may be directed to systems operating at other frequencies and/or having different unit times.

In example operation of the operating speed detecting apparatus 100, if 10 ns elapses after a clock signal IN is applied to the first delay circuit 111 and a tenth delay circuit (not shown) outputs an output signal Del 10 (not shown), the frequency of the clock signal IN may be determined to be 100 MHz. Likewise, if 11 ns elapses after the clock signal IN is applied to the first delay circuit 111 and a eleventh delay circuit (not shown) responds to the clock signal IN, the frequency of the clock signal IN may be determined to be 90.9 MHz.

In example operation of the operating speed detecting apparatus 100, if the determined frequency of the clock signal IN is not satisfactory (e.g., above a higher threshold, below a lower threshold, etc.), the frequency of the clock signal IN may be adjusted by controlling a threshold voltage of a transistor. For example, if the determined frequency of the clock signal IN is below the lower threshold, the threshold voltage may be increased so as to increase an operating voltage which may thereby increase the frequency of the clock signal IN.

In example operation of the operating speed detecting apparatus 100, if the status register 133 stores the output signal OUT indicating that the operating speed or frequency of the clock signal IN operates below the lower threshold, the operating voltage may be increased by adjusting a voltage regulator (not shown) in a system using the stored output signal OUT. Alternately, the operating speed/frequency of the clock signal IN may be increased by lowering a peripheral temperature of the semiconductor chip using a cooler (not shown) (e.g., a passive heat sink, a heat sink and fan combination, a water cooling system, a cryo-cooler, etc.).

In example operation of the operating speed detecting apparatus 100, if the status register 133 stores the output signal OUT indicating that the operating speed or frequency of the clock signal IN operates above the higher threshold, a power consumption of the semiconductor chip may be reduced by lowering an operating voltage (e.g., with a voltage regulator).

In example operation of the operating speed detecting apparatus 100, if the status register 133 stores the output signal OUT indicating that the operating speed or frequency of the clock signal IN operates either above the higher threshold or below the lower threshold, the frequency of the clock signal IN may be adjusted with a phase locked loop (PLL) to compensate for the frequency difference.

Figure 5:
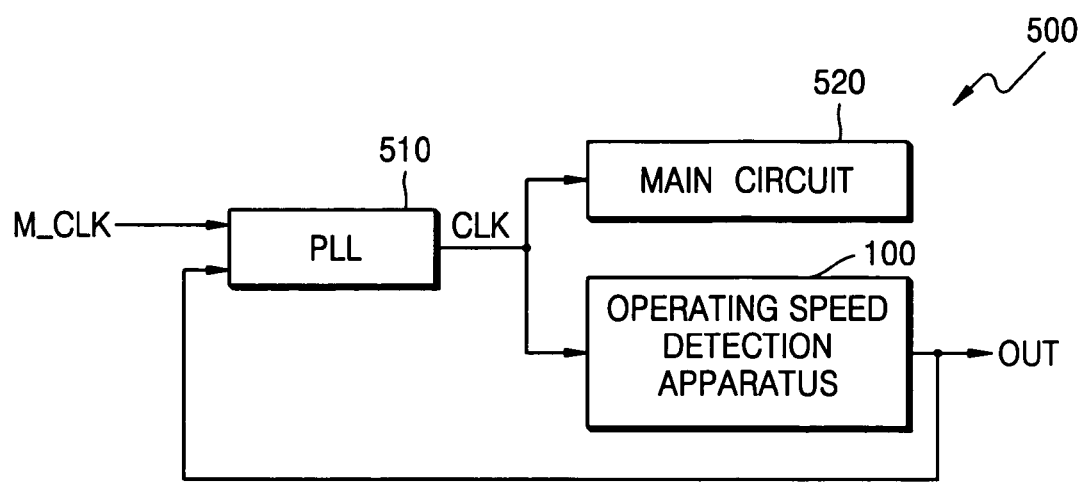
FIG. 5 is a block diagram illustrating a system including the operating speed detection apparatus of FIG. 1 according to another embodiment of the present invention.

FIG. 5 is a block diagram illustrating a system 500 including the operating speed detection apparatus 100 of FIG. 1 according to another embodiment of the present invention.

In the example embodiment of FIG. 5, the system 500 may include a PLL 510, a main circuit 520 and the operating speed detection apparatus 100 of FIG. 1.

In the example embodiment of FIG. 5, the PLL 510 may generate a clock signal CLK of the system 500 based on a main clock signal M_CLK and the output signal OUT output by the operating speed detection apparatus 100.

In the example embodiment of FIG. 5, the main circuit 520 may perform any well-known processing function (e.g., a calculating operation, a memory operation, etc.) using the clock signal CLK.

In the example embodiment of FIG. 5, the operating speed detection apparatus 100 may detect an operating speed of the system 500 based on the clock signal CLK and may generate the output signal OUT which may indicate the determined operating speed of the clock signal CLK.

In the example embodiment of FIG. 5, the output signal OUT may be used to control a number of system parameters, such as an operating voltage of the system 500. In an alternative example, the output signal OUT may be used to control a cooling system (not shown) for reducing a temperature of the system 500. In another alternative example, the output signal OUT may be used to predict errors in the operation of circuits due to system asymmetry, which may occur, at least in part, based on an operating speed fluctuation indicated by the output signal OUT. In another alternative example, the output signal OUT may be used to predict errors in the operation of circuits, which may be disposed on a power supply line of the system, due to a voltage drop.

In another example embodiment of the present invention, the output signal OUT of the operating speed detection apparatus 100 may be used in accordance with a number of control schemes, such as an automatic control scheme, a manual control scheme and a combination automatic/manual control scheme.

In the example embodiment of the automatic control scheme, a controller included in a system (e.g., system 500) may be utilized. A program may execute at a controller such that an internal operating voltage of a semiconductor chip may be controlled in accordance with the executed program. In a further example, the system may include a cooling system (e.g., installed outside of the semiconductor chip) which may likewise be controlled by the executed program.

In another example embodiment of the present invention, operating parameters (e.g., voltage fluctuations, frequency fluctuations, etc.) of a circuit may be adjusted based on a detected operating frequency. For example, if a voltage margin for a circuit exceeds a threshold, a voltage regulator may be adjusted such that a given clock speed may be maintained while power consumption of the circuit may be reduced. In another example, if a Process, Voltage, Temperature (PVT) condition is unsuited to a given clock speed, the PVT condition may be stabilized by controlling the voltage regulator and maintaining the voltage margin, or alternatively by lowering the clock speed (e.g., with a PLL). Such a control scheme may be performed automatically with executable code a controller of the semiconductor chip. Alternatively, the control scheme may be performed by allowing a user to manually adjust operating parameters based on the detected operating frequency. Alternatively, a combination of manual and automatic controls may be used.

Example embodiments of the present invention being thus described, it will be obvious that the same may be varied in many ways. For example, while the above-described example embodiments of the present invention are directed generally to adjusting operating parameters of a mobile electronic device, it is understood that other example embodiments of the present invention may be directed to any type of electronic processing device. Likewise, while particular numbers and parameter values have been given in above-described example embodiments, it is understood that any particular numbers and/or parameter values given above are given for purposes of example only, and other example embodiments of the present invention may be configured for operation with other numbers and/or parameter values (e.g., frequencies, delay times, etc.).

Such variations are not to be regarded as departure from the spirit and scope of example embodiments of the present invention, and all such modifications as would be obvious to one skilled in the art are intended to be included within the scope of the following claims.

What is claimed is:

1. An operating speed detection apparatus detecting an operating speed, comprising:
    a delay block delaying a clock signal to generate a plurality of delayed clock signals; and
    a detection block outputting a plurality of detection signals indicating the operating speed, each of the plurality of detection signals being generated based on a comparison of the clock signal and a corresponding delayed clock signal of the plurality of delayed clock signals, wherein each of the plurality of detection signals indicates delay time information of the clock signal.

2. The apparatus of claim 1, wherein the plurality of delayed clock signals include first through N-th delay clock signals and the plurality of detection signals include first through N-th detection signals, N being an integer which is greater than or equal to 1.

3. The apparatus of claim 2, wherein the delay block includes:
    a first delay circuit delaying the clock signal by a unit time to generate a first delay signal;
    a second delay circuit delaying the first delay signal by the unit time to generate a second delay signal; and
    an N-th delay circuit delaying a received (N-1)-th delay signal by the unit time to generate an N-th delay signal.

4. The apparatus of claim 3, wherein each of the first through N-th delay circuits includes a buffer.

5. The apparatus of claim 3, wherein the unit time is 1 nanosecond (ns).

6. The apparatus of claim 3, wherein the detection block includes:
    a first detection circuit comparing the first delay signal with the clock signal and outputting a first detection signal based on the comparison;
    a second detection circuit comparing the second delay signal with the clock signal and outputting a second detection signal based on the comparison; and
    a N-th detection circuit comparing the N-th delay signal with the clock signal and outputting a N-th detection signal based on the comparison 7. The apparatus of claim 6, wherein each of the first through N-th detection circuits includes at least one Boolean logic gate.

8. The apparatus of claim 7, wherein the at least one Boolean logic gate includes an Exclusive OR (XOR) gate.

9. The apparatus of claim 1, further comprising:
    a determination block determining the operating speed based on the plurality of detection signals.

10. The apparatus of claim 9, wherein the determination block includes:
    a multiplexer selecting at least one of the plurality of detection signals;
    a determination circuit determining the operating speed based on the at least one selected detection signal; and
    a status register performing at least one of storing and outputting the operating speed determined by the determination circuit.

11. A system including a plurality of functional blocks operating in response to a clock signal, comprising:
    an operating speed detection apparatus detecting an operating speed of the plurality of functional blocks, the operating speed detection apparatus including:
    a delay block delaying a clock signal to generate a plurality of delayed clock signals; and
    a detection block outputting a plurality of detection signals indicating the operating speed, each of the plurality of detection signals being generated based on a comparison of the clock signal and a corresponding delayed clock signal of the plurality of delayed clock signals, wherein each of the plurality of detection signals indicates delay time information of the clock signal.

12. The system of claim 11, wherein an operating voltage of the system is adjusted based on the operating speed detected by the operating speed detection apparatus.

13. The system of claim 11, wherein a frequency of the clock signal is adjusted based on the operating speed detected by the operating speed detection apparatus.

14. The system of claim 11, further comprising:
    a Phase Locked Loop (PLL) generating a clock signal using a main clock signal based on an output signal output by the operating speed detection apparatus; and
    a main circuit performing an operational function in response to the clock signal.

15. The system of claim 14, wherein the output signal is used to control an operating voltage of the system.

16. The system of claim 14, wherein the output signal is used to control a cooling system capable of reducing a temperature of the system.

17. The system of claim 14, wherein the operating speed detection apparatus is used to predict errors in an operation of the system.

18. The system of claim 14, wherein the operating speed detection apparatus is used to predict errors in an operation of circuits that are disposed on a power supply line of the system.

19. A method for detecting an operating speed, comprising:
    delaying a received clock signal to generate a plurality of delayed clock signals;
    generating a plurality of detection signals based on a comparison of the received clock signal and a corresponding delayed clock signal of the plurality of delayed clock wherein each of the plurality of detection signals indicates delay time information of the clock signal; and
    determining the operating speed based at least in part on the plurality of detection signals.

20. The method of claim 19, wherein the plurality of delayed clock signals include first through N-th delay signals, a first delay signal delayed from the received clock signal by a unit time, a second delay signal delayed from the first delay signal by the unit time and a N-th delay signal delayed from a (N- 1)-th delay signal by the unit time, wherein N is an integer greater than or equal to 1.

21. The method of claim 20, wherein the unit time is 1 nanosecond (ns).

22. The method of claim 20, wherein the plurality of detection signals include first through N-th detection signals, a first detection signal generated based on a comparison of the first delay signal with the received clock signal, a second detection signal generated based on a comparison of the second delay signal with the received clock signal, and a N-th detection signal generated based on a comparison of a (N-1)-th delay signal with the received clock signal, wherein N is an integer greater than or equal to 1.

23. The method of claim 19, further comprising:
 storing the determined operating speed.

24. An operating speed detection apparatus performing the method of claim 19.

25. A system including an operating speed detection apparatus performing the method of claim 19.

* * * * *